(12) United States Patent
Hayashi et al.

(10) Patent No.: US 10,869,399 B2
(45) Date of Patent: Dec. 15, 2020

(54) ELECTRIC DEVICE

(71) Applicant: Mitsubishi Electric Corporation, Tokyo (JP)

(72) Inventors: Ryohei Hayashi, Tokyo (JP); Jiro Yoshizawa, Tokyo (JP); Kohei Seike, Tokyo (JP)

(73) Assignee: Mitsubishi Electric Cornoration, Tokyo (JP)

( * ) Notice: Subject to any disclaimer, the term of this patent is extended or adjusted under 35 U.S.C. 154(b) by 0 days.

(21) Appl. No.: 16/702,872

(22) Filed: Dec. 4, 2019

(65) Prior Publication Data

US 2020/0236798 A1 Jul. 23, 2020

(30) Foreign Application Priority Data

Jan. 22, 2019 (JP) .................. 2019-008334

(51) Int. Cl.
*H05K 5/02* (2006.01)
*H05K 5/06* (2006.01)
*H05K 5/00* (2006.01)
*H01R 12/53* (2011.01)
*H01R 12/58* (2011.01)

(52) U.S. Cl.
CPC ......... *H05K 5/0069* (2013.01); *H05K 5/0247* (2013.01); *H01R 12/53* (2013.01); *H01R 12/58* (2013.01)

(58) Field of Classification Search
CPC .... H05K 5/0247; H05K 5/069; H05K 5/0204; H05K 5/0221; H01R 12/53; H01R 12/57; H01R 12/58
See application file for complete search history.

(56) References Cited

U.S. PATENT DOCUMENTS

| | | | | |
|---|---|---|---|---|
| 6,679,708 B1* | 1/2004 | Depp | .................. | H01R 9/2466 361/752 |
| 8,247,708 B1* | 8/2012 | Ayres, III | .............. | H05K 5/069 174/564 |
| 9,640,931 B2* | 5/2017 | Hayashi | .................. | G06F 1/185 |
| 2002/0189840 A1* | 12/2002 | Ohta | ..................... | H02G 3/088 174/68.1 |
| 2008/0081517 A1* | 4/2008 | Jaklin | .................. | H05K 5/0247 439/638 |
| 2008/0304200 A1* | 12/2008 | Hotchkiss | ............ | H05K 9/0066 361/111 |

(Continued)

FOREIGN PATENT DOCUMENTS

JP 06-050257 U 7/1994

*Primary Examiner* — Hoa C Nguyen
(74) *Attorney, Agent, or Firm* — Sughrue Mion, PLLC; Richard C. Turner

(57) ABSTRACT

Provided is an electric device that includes a connector holder for positioning a connector relative to a control board and fixing a harness. In the electric device, a board-in connector for wire-to-board connection is disposed at an end of a harness for electrical connection, and terminals of the board-in connector are soldered and fixed to terminals in a control board. The electric device includes a connector holder fixed to a housing together with the control board. The connector holder includes a fixation portion for fixing the board-in connector to the connector holder, and a holding portion for holding and fixing the harness.

16 Claims, 4 Drawing Sheets

(56) References Cited

U.S. PATENT DOCUMENTS

| | | | |
|---|---|---|---|
| 2015/0231975 A1* | 8/2015 | Ishii | B60L 50/13 |
| | | | 307/10.1 |
| 2016/0020680 A1* | 1/2016 | Hattori | H02K 5/225 |
| | | | 310/72 |
| 2016/0183388 A1* | 6/2016 | Murakami | G06F 1/189 |
| | | | 361/679.21 |
| 2017/0113634 A1* | 4/2017 | Tanaka | B62K 25/283 |
| 2018/0076616 A1* | 3/2018 | Thrush | H01H 9/0228 |
| 2019/0082545 A1* | 3/2019 | Loibl | H05K 7/20854 |
| 2020/0153135 A1* | 5/2020 | Rossman | H01R 12/722 |

* cited by examiner

ELECTRIC DEVICE

BACKGROUND OF THE INVENTION

1. Field of the Invention

The present disclosure relates to an electric device in which a connector for wire-to-board connection is fixed to a connector holder for holding a harness for electrical connection, and a terminal of the connector is soldered and fixed to a terminal in a control board.

2. Description of the Background Art

There have been structures in which a terminal of a harness inserted from the outside into a housing of an in-vehicle power conversion device for receiving a control signal from the in-vehicle power conversion device or outputting a control signal to the in-vehicle power conversion device, is connected to a terminal in a control board in the housing. Among such structures, the following structures are widely used: a structure in which an on-board connector is mounted on a control board, and a harness and the connector are connected to each other; and a structure, using a board-in connector (connector for wire-to-board connection), in which the board-in connector directly connected to a harness is mounted to a board.

Power conversion devices with such structures have the following problems. If an on-board connector is used, the number of components and cost increase. Meanwhile, if a board-in connector is used, the board-in connector has to be fixed, when being mounted to a board, until being soldered and fixed to the board.

As a measure for fixing the board-in connector at the time of the mounting until the board-in connector is soldered and fixed, structures have been proposed in which ends of terminals of a connector to be inserted in connection holes formed in a board, are each formed into a truncated V shape, and positioning is performed such that the tip of a core wire pinched through crimping by claws projects from the board in a state where the end of each terminal is inserted in the board (see, for example, Patent Document 1).

Patent Document 1: Japanese Laid-Open Utility Model Publication No. 6-50257

However, the conventional example in Patent Document 1 has the following problem. At the time of the soldering and fixing or product assembling, a harness connected to the board-in connector needs to be fixed by means of tape or a hook portion provided to an assembly jig such that the harness does not move to any unintended position.

Such fixing operations may cause increase in the operation time taken for the mounting to the board or an assembling operation.

SUMMARY OF THE INVENTION

The present disclosure has been made to solve the above problems, and an object of the present disclosure is to provide an electric device that includes a connector holder for positioning a connector relative to a control board and fixing a harness.

An electric device according to the present disclosure is an electric device in which a board-in connector for wire-to-board connection is disposed at an end of a harness for electrical connection, and a terminal of the board-in connector is soldered and fixed to a terminal in a control board. The electric device includes a connector holder fixed to a housing together with the control board. The connector holder includes a fixation portion for fixing the board-in connector to the connector holder, and a holding portion for holding and fixing the harness.

The present disclosure has the following advantageous effects. When the board-in connector is mounted to the board, the positions of the connector and the control board are kept unchanged until the connector is soldered and fixed to the board, and thus failure in the mounting can be prevented. In addition, since the harness is fixed to the connector holder, no fixing operation for the harness is necessary at the time of the mounting to the board or an assembling operation, and thus the operation time can be shortened.

DETAILED DESCRIPTION OF THE PREFERRED EMBODIMENTS OF THE INVENTION

First Embodiment

Hereinafter, an electric device according to a first embodiment of the present disclosure will be described with reference to FIG. 1 to FIG. 6.

Figure 1:
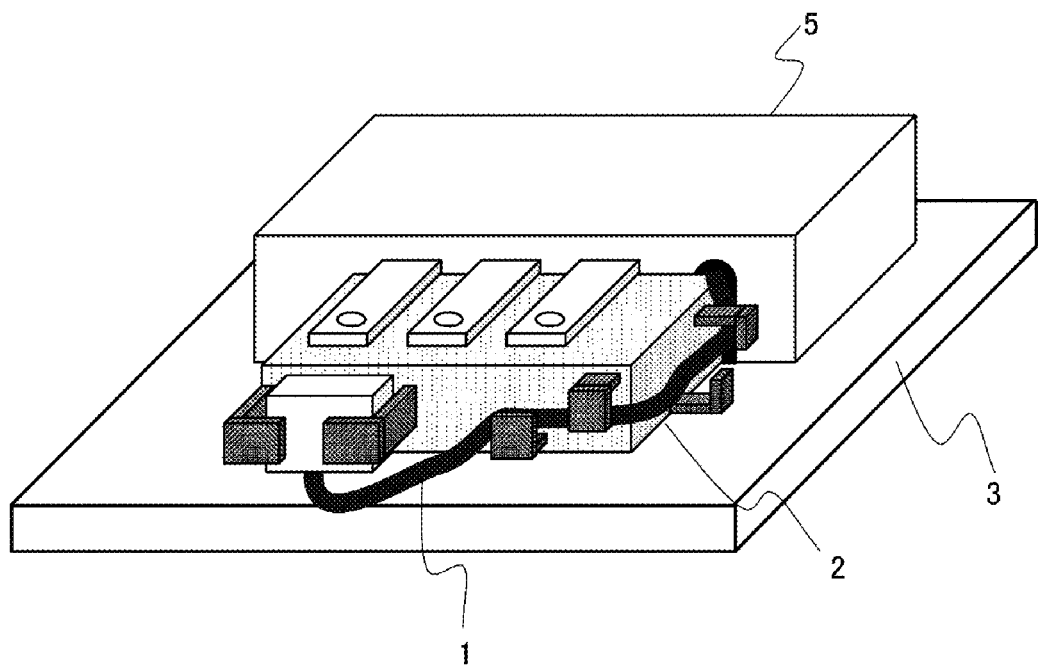
FIG. 1 is an external view of an electric device according to a first embodiment.
Figure 2:
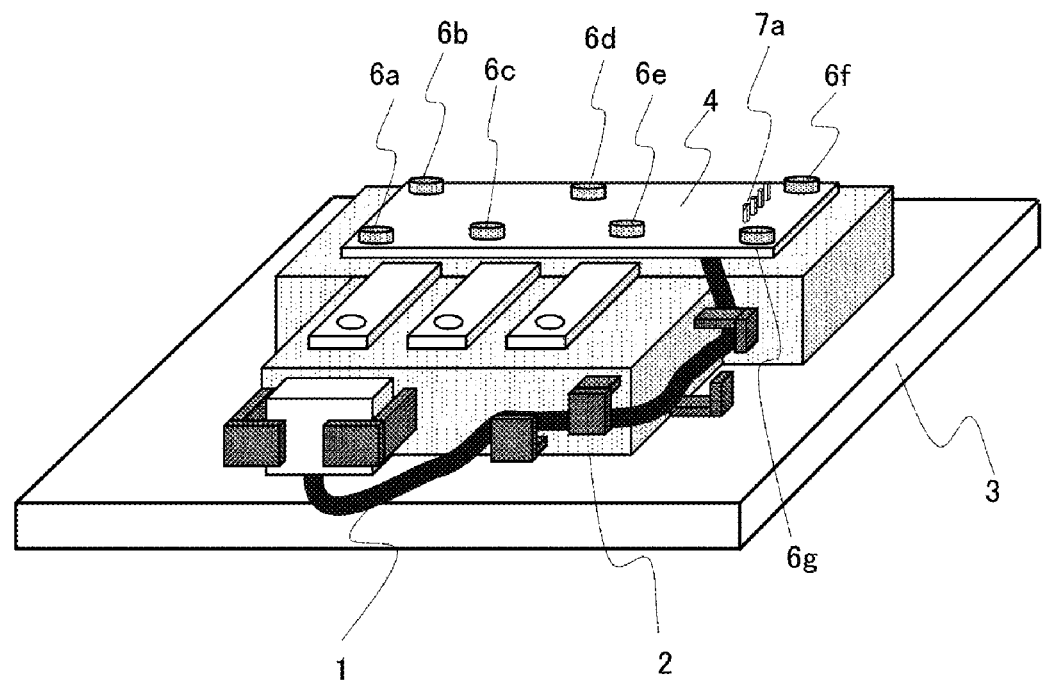
FIG. 2 is a view of the electric device according to the first embodiment from which a cover is detached.
Figure 3:
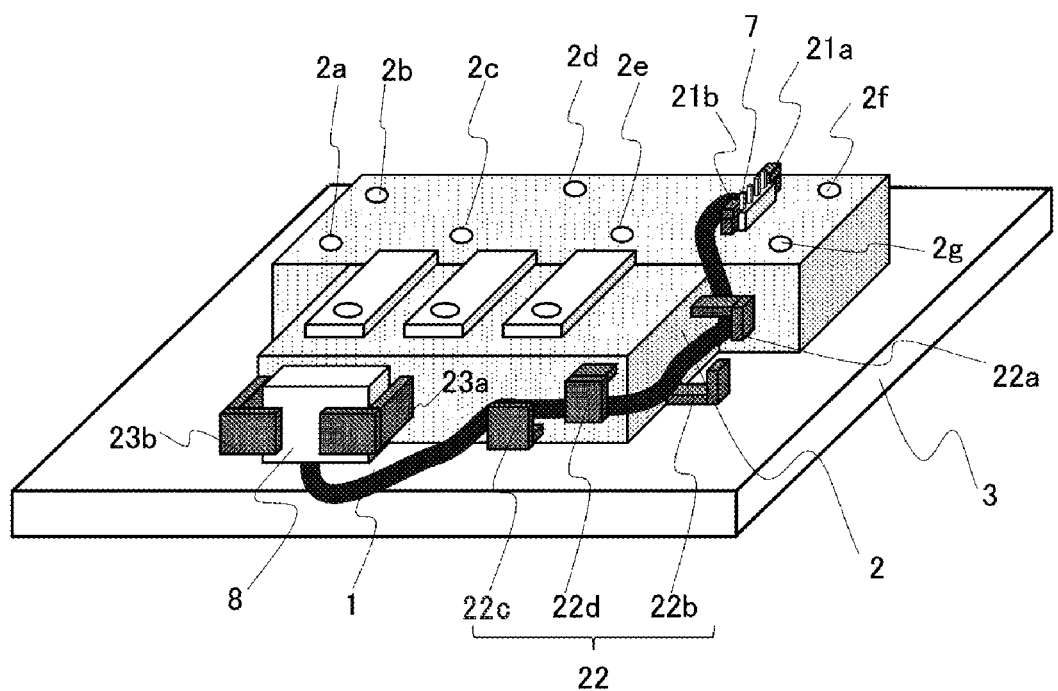
FIG. 3 is a view of the electric device according to the first embodiment from which a control board is detached.

FIG. 1 is an external view of an in-vehicle power conversion device as the electric device according to the first embodiment. FIG. 2 shows the electric device from which a cover for covering a control board is detached. FIG. 3 shows the electric device from which the control board is detached.

Figure 4:
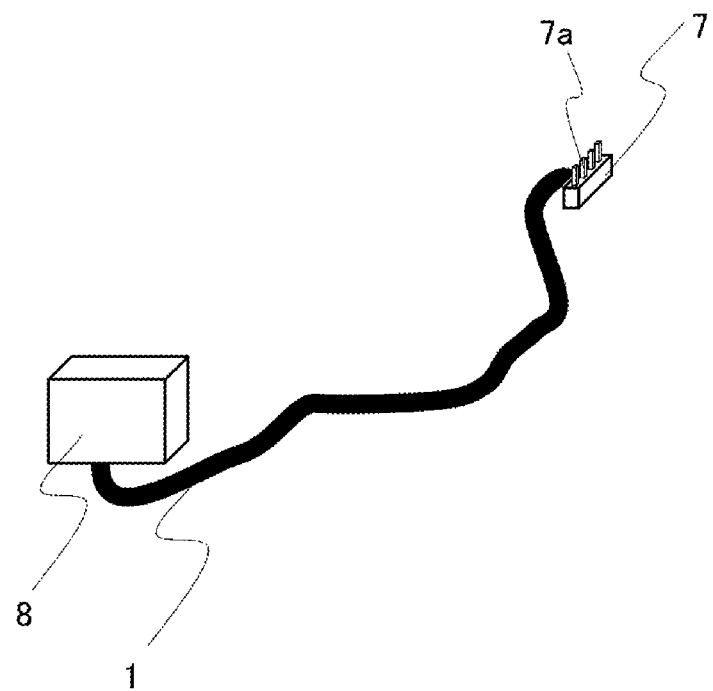
FIG. 4 is an external view of a harness used in the electric device according to the first embodiment.
Figure 5:
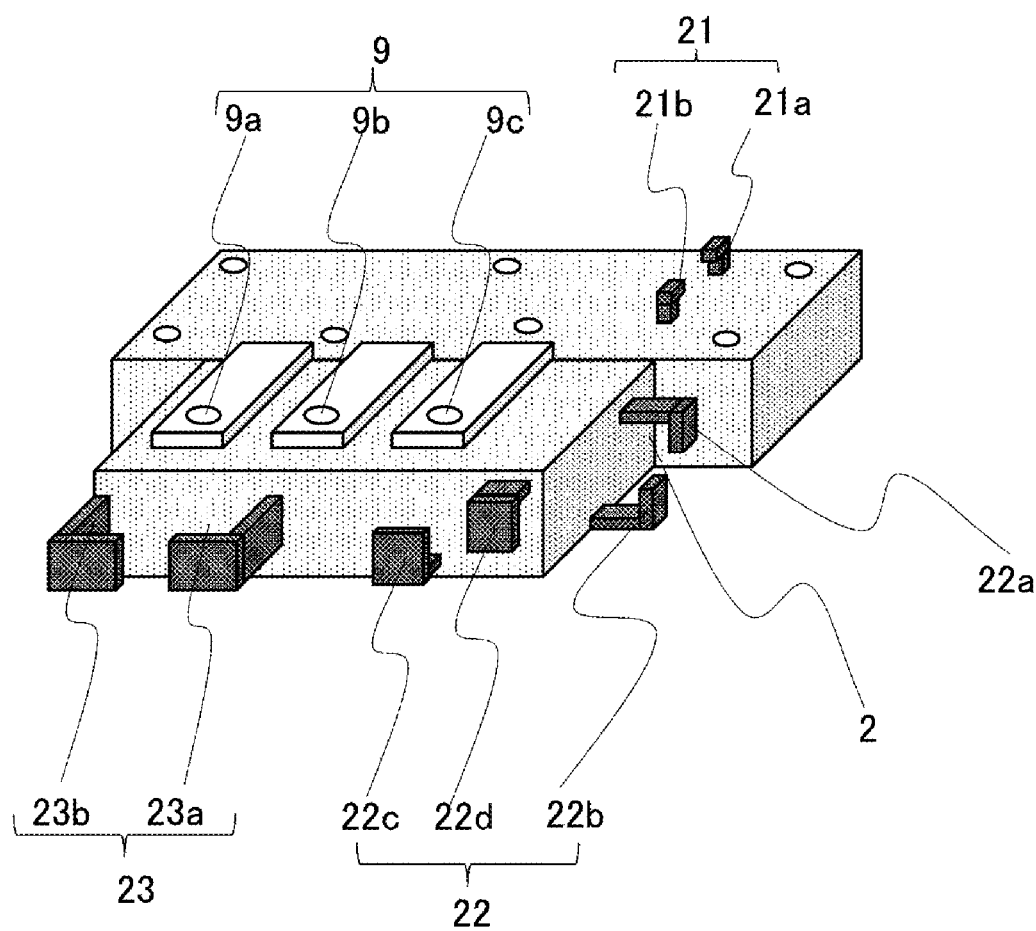
FIG. 5 is an external view of a connector holder used in the electric device according to the first embodiment.
Figure 6:
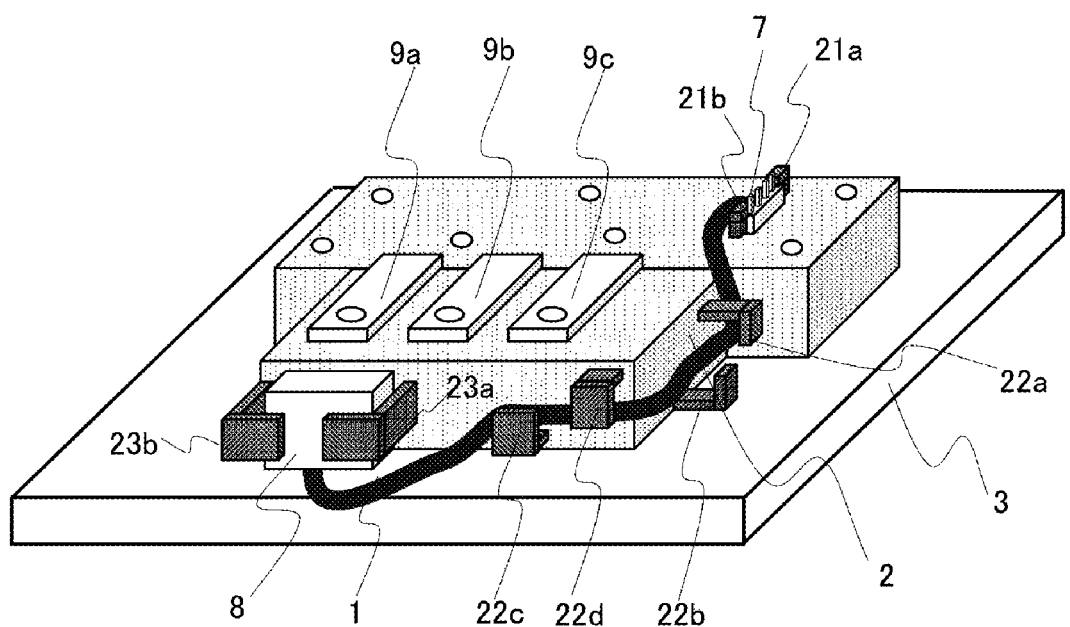
FIG. 6 illustrates a state where the harness is fixed to the connector holder used in the electric device according to the first embodiment.

FIG. 4 is an external view of a harness used in the electric device. FIG. 5 is an external view of a connector holder used in the electric device. FIG. 6 illustrates a state where the harness shown in FIG. 4 is fixed to the connector holder shown in FIG. 5.

In FIG. 1 to FIG. 3, a harness 1 through which a control signal is received from or outputted to the in-vehicle power conversion device is, from the outside, held by and fixed to a connector holder 2, inserted in a housing 3, and electrically connected to a control board 4 of the in-vehicle power conversion device. The control board 4 is usually covered by a cover 5 as shown in FIG. 1, and processes a control signal and performs control so as to receive or output a control signal.

The connector holder 2 and the control board 4 are fixed to the housing 3 by means of a plurality of fixation portions 6a to 6g implemented by screws or the like, so that the relative position between the connector holder 2 and the control board 4 is determined. Fixation portions through which the screws or the like serving as the fixation portions 6a to 6g are inserted, are formed in the connector holder 2 and the control board 4, and the connector holder 2 shown in FIG. 3 has therein fixation portions 2a to 2g implemented by screw holes or the like for fixing the control board 4.

Next, the harness 1 and the connector holder 2 for holding the harness 1 will be described in detail with reference to FIG. 4 to FIG. 6.

FIG. 4 shows the harness 1 alone. A board-in connector 7 for wire-to-board connection is disposed at one end of the harness 1, and an external-connection connector 8 for connection to an external circuit is disposed at the other end of the harness 1. The board-in connector 7 is provided with connection terminals 7a which are soldered so as to be electrically connected to terminals in the control board 4.

FIG. 5 shows the connector holder 2 alone from which the harness 1 is detached. The connector holder 2 is molded from resin, and the following components are molded so as to be integrated with the connector holder 2: fixation portions 21a and 21b (denoted by "21" when collectively called) implemented by claw-shaped portions for fixing the board-in connector 7 disposed at the one end of the harness 1; a holding portion 22 which is composed of a plurality of claw-shaped portions 22a to 22c and a wall 22d, and which holds and fixes the harness 1; and recess-shaped portions 23a and 23b (denoted by "23" when collectively called) for holding the external-connection connector 8 disposed at the other end of the harness 1. The recess-shaped portions 23a and 23b may be substituted with claw-shaped portions which are engaged with the external-connection connector 8 so as to hold the external-connection connector 8.

A terminal base 9 made of busbars that serve as connection terminals for supplying power or outputting AC current is provided to the connector holder 2 such that three terminals 9a to 9c for U-phase, V-phase, and W-phase made of a conductive material such as copper or aluminum are molded integrally with the connector holder 2 molded from resin. In this manner, the connector holder 2 and the terminal base 9 can be integrated with each other.

FIG. 6 illustrates a state where the harness 1 shown in FIG. 4 is combined with the connector holder 2 shown in FIG. 5.

As shown in FIG. 6, the board-in connector 7 for wire-to-board connection disposed at the one end of the harness 1 is first engaged with the fixation portions 21a and 21b implemented by the claw-shaped portions of the connector holder 2, so that the board-in connector 7 is fixed to the connector holder 2.

Then, the harness 1 is engaged with the plurality of claw-shaped portions 22a to 22c and the wall 22d of the holding portion 22 provided to the connector holder 2, so that the harness 1 is held by and fixed to the connector holder 2.

Then, the external-connection connector 8 disposed at the other end of the harness 1 is held and fixed by the recess-shaped portions 23a and 23b of the connector holder 2.

As described above, the board-in connector 7 is fixed by the fixation portions 21 provided to the connector holder 2, the harness 1 is held and fixed by the holding portion 22 provided to the connector holder 2, and the external-connection connector 8 is held and fixed by fixation portions, that is, the recess-shaped portions 23 provided to the connector holder 2, so that the relative position between the connector holder 2 and the harness 1 is determined. Accordingly, the following advantageous effect is obtained. No fixing operation for the harness 1, the board-in connector 7, and the external-connection connector 8 is necessary at the time of the mounting to the board or an assembling operation, and thus the operation time can be shortened.

An assembly composed of the harness 1 and the connector holder 2 is accommodated in the housing 3 as shown in FIG. 6, and the connection terminals 7a of the board-in connector 7 fixed to the connector holder 2 are inserted in terminals in through holes of the control board 4, as shown in FIG. 2. Then, the connector holder 2 and the control board 4 are fixed to the housing 3 by means of the plurality of fixation portions 6a to 6g implemented by screws or the like, so that the relative position between the connector holder 2 and the control board 4 is determined. In this state, the connection terminals 7a of the board-in connector 7, and the terminals in the through holes of the control board 4, are soldered so as to be electrically connected to each other.

Thus, the relative position between the board-in connector 7 and the control board 4 fixed to the connector holder 2 is determined, and the connection terminals 7a of the board-in connector 7 inserted in the through holes formed in the control board 4 are kept at stable positions in a step of soldering and fixing the terminals in the through holes and the connection terminals 7a to each other, whereby failure in the mounting can be prevented. In addition, no fixing operation is necessary at the time of the mounting to the board, and thus the operation time can be shortened.

The above described electric device according to the present disclosure has the following advantageous effects. The function of fixing the connector disposed at the one end of the harness 1, the function of fixing the harness 1, the function of fixation to the control board 4, and the function of the terminal base 9, are exerted by a single component, that is, the connector holder 2, whereby the number of components can be reduced, and the time taken for an assembling operation can be shortened.

Although the disclosure is described above in terms of an exemplary embodiment, it should be understood that the various features, aspects and functionality described in the embodiment are not limited in their applicability to the particular embodiment with which they are described, but instead can be applied alone or in various combinations to the embodiment of the disclosure.

It is therefore understood that numerous modifications which have not been exemplified can be devised without departing from the scope of the present disclosure. For example, at least one of the constituent components may be modified, added, or eliminated.

DESCRIPTION OF THE REFERENCE CHARACTERS 1 harness
2 connector holder
2a to 2g fixation portion for fixing control board 4
3 housing
4 control board
6a to 6g fixation portion
7 board-in connector
7a connection terminal of board-in connector 7
8 external-connection connector
9 terminal base
21 fixation portion for board-in connector 7
22 holding portion for harness 1
23 holding portion for external-connection connector

What is claimed is:

1. An electric device in which a board-in connector for wire-to-board connection is disposed at an end of a harness for electrical connection, and a terminal of the board-in connector is soldered and fixed to a terminal in a control board, the electric device comprising a connector holder fixed to a housing together with the control board, wherein the connector holder includes a fixation portion to fix the board-in connector to the connector holder, and a holding portion to hold and fix the harness.

2. The electric device according to claim 1, wherein the connector holder is provided with a fixation portion to fix the control board.

3. The electric device according to claim 2, wherein the connector holder is molded from resin, and, as the fixation portion to fix the board-in connector to the connector holder, a claw-shaped portion provided to the connector holder is engaged with the board-in connector so as to fix the board-in connector.

4. The electric device according to claim 2, wherein the connector holder is molded from resin, and, as the holding portion to hold and fix the harness, a plurality of claw-shaped portions provided to the connector holder are engaged with the harness so as to hold the harness.

5. The electric device according claim 2, wherein an external connector for connection to an external circuit is disposed at an end, of the harness, that is located on a side opposite to the board-in connector side, and the connector holder is provided with a recess-shaped portion to hold the external connector, or a claw-shaped portion which is engaged with the external connector.

6. The electric device according to claim 2, wherein a busbar that serves as a connection terminal to supply power or output AC current is molded integrally with the connector holder, to form a terminal base.

7. The electric device according to claim 1, wherein the connector holder is molded from resin, and, as the fixation portion to fix the board-in connector to the connector holder, a claw-shaped portion provided to the connector holder is engaged with the board-in connector so as to fix the board-in connector.

8. The electric device according to claim 7, wherein the connector holder is molded from resin, and, as the holding portion to hold and fix the harness, a plurality of claw-shaped portions provided to the connector holder are engaged with the harness so as to hold the harness.

9. The electric device according to claim 7, wherein an external connector for connection to an external circuit is disposed at an end, of the harness, that is located on a side opposite to the board-in connector side, and the connector holder is provided with a recess-shaped portion to hold the external connector, or a claw-shaped portion which is engaged with the external connector.

10. The electric device according to claim 7, wherein a busbar that serves as a connection terminal to supply power or output AC current is molded integrally with the connector holder, to form a terminal base.

11. The electric device according to claim 1, wherein the connector holder is molded from resin, and, as the holding portion to hold and fix the harness, a plurality of claw-shaped portions provided to the connector holder are engaged with the harness so as to hold the harness.

12. The electric device according claim 11, wherein an external connector for connection to an external circuit is disposed at an end, of the harness, that is located on a side opposite to the board-in connector side, and the connector holder is provided with a recess-shaped portion to hold the external connector, or a claw-shaped portion which is engaged with the external connector.

13. The electric device according to claim 11, wherein a busbar that serves as a connection terminal to supply power or output AC current is molded integrally with the connector holder, to form a terminal base.

14. The electric device according to claim 1, wherein an external connector for connection to an external circuit is disposed at an end, of the harness, that is located on a side opposite to the board-in connector side, and the connector holder is provided with a recess-shaped portion to hold the external connector, or a claw-shaped portion which is engaged with the external connector.

15. The electric device according to claim 14, wherein a busbar that serves as a connection terminal to supply power or output AC current is molded integrally with the connector holder, to form a terminal base.

16. The electric device according to claim 1, wherein a busbar that serves as a connection terminal to supply power or output AC current is molded integrally with the connector holder, to form a terminal base.

* * * * *